United States Patent [19]
Uchida

[11] 3,895,376
[45] July 15, 1975

[54] DUAL SLOPE INTEGRATING ANALOG TO DIGITAL CONVERTER

[75] Inventor: Kozo Uchida, Tokyo, Japan

[73] Assignee: Iwatsu Electric Co., Ltd., Tokyo, Japan

[22] Filed: Oct. 19, 1972

[21] Appl. No.: 298,854

[30] Foreign Application Priority Data

| | | |
|---|---|---|
| Oct. 26, 1971 | Japan | 46-84839 |
| Oct. 26, 1971 | Japan | 46-84840 |
| Oct. 26, 1971 | Japan | 46-84842 |
| Oct. 26, 1971 | Japan | 46-84843 |
| Oct. 26, 1971 | Japan | 46-84844 |

[52] U.S. Cl. ....... 340/347 NT; 324/99 D; 324/62 R; 340/347 CC; 340/347 AD

[51] Int. Cl. .......... H03k 13/20

[58] Field of Search...340/347 NT, 347 AD, 347 CC; 324/99 D, 111, 62; 235/183

[56] References Cited

UNITED STATES PATENTS

| | | | |
|---|---|---|---|
| 3,434,062 | 3/1969 | Cox | 340/347 NT X |
| 3,475,748 | 10/1969 | Price et al. | 340/347 NT |
| 3,479,589 | 11/1969 | Owens | 324/62 |
| 3,490,039 | 1/1970 | Tsao | 324/62 |
| 3,566,397 | 2/1971 | Walton | 340/347 NT |
| 3,569,957 | 3/1971 | Masterson | 340/347 NT |
| 3,711,850 | 1/1973 | Kelly | 340/347 NT |

OTHER PUBLICATIONS

Ammann "Electronics," Nov. 16, 1964 pp. 92–96.

*Primary Examiner*—Charles D. Miller
*Attorney, Agent, or Firm*—Woodcock, Washburn, Kurtz & Mackiewicz

[57] ABSTRACT

An analog to digital converter of dual slope integrating type includes a standard voltage source, a first resistor connected to ground from one terminal of the standard voltage source, a second resistor connected to ground from the other terminal of the standard voltage source and means arranged to transmit a standard signal or an input signal to be measured from the first and second resistors to the integrator through switch means.

15 Claims, 15 Drawing Figures

DUAL SLOPE INTEGRATING ANALOG TO DIGITAL CONVERTER

BACKGROUND OF THE INVENTION

This invention relates to an analog to digital converter of dual slope integrating type, particularly for use as a digital voltmeter, digital ohmmeter or digital multimeter.

Analog to digital converters of dual slope integrating type are well known. The input signal is used to cause the output of an integrator to ramp up and an opposing standard voltage source is used to cause ramp down. In effecting a voltage measurement, the input voltage is applied to effect ramp up from a threshold and then removed and replaced by the opposing voltage to effect ramp down to the threshold. The ratio of the input voltage to the standard voltage is given by the ratio of the number of clock pulses counted during the application of the standard voltage to the number of clock pulses occurring during the application of the input voltage.

A disadvantage of known dual slope converters is that, in order to be able to handle input voltages of either polarity, it is necessary to employ standard voltage sources of opposite polarity or complex switching arrangements for reversing the polarity of one standard source.

Furthermore, to enable resistance measurements to be made, a reference current source is required to pass a current through the unknown resistance and thereby generate thereacross the input voltage to be measured.

SUMMARY OF THE INVENTION

One object of this invention is to provide a smallsized analog to digital converter of low cost and high precision.

A further object of this invention is to provide a digital ohmmeter that does not need a precision current source.

A still further object of this invention is to provide a digital multimeter that uses one standard voltage source for both voltage and resistance measurements.

A still further object of this invention is to provide a digital multimeter that uses one resistor for both voltage and resistance measurements.

A still further object of this invention is to provide a digital ohmmeter and a digital multimeter in which it is easy to provide a protecting circuit.

In accordance with this invention, there is provided a dual slope integrating analog to digital converter comprising a standard voltage souce having first and second terminals connected to ground through a first known resistor and second reference resistor so as to supply a direct current simultaneously to the first and a second terminals, first and second switches connecting the first and second terminals to the input of an integrating circuit, a switch controlling circuit for closing one of the switches at a predetermined instant and for opening this switch under the control of a comparator circuit which detects when the output of the integrating circuit reaches a predetermined threshold, and means for counting clock pulses while the said one of the switches is closed.

The ensuing description will show how such a converter can be arranged to meet all of the foregoing objects.

The invention will be described in more detail, by way of example, with reference to the accompanying drawings.

Figure 1:
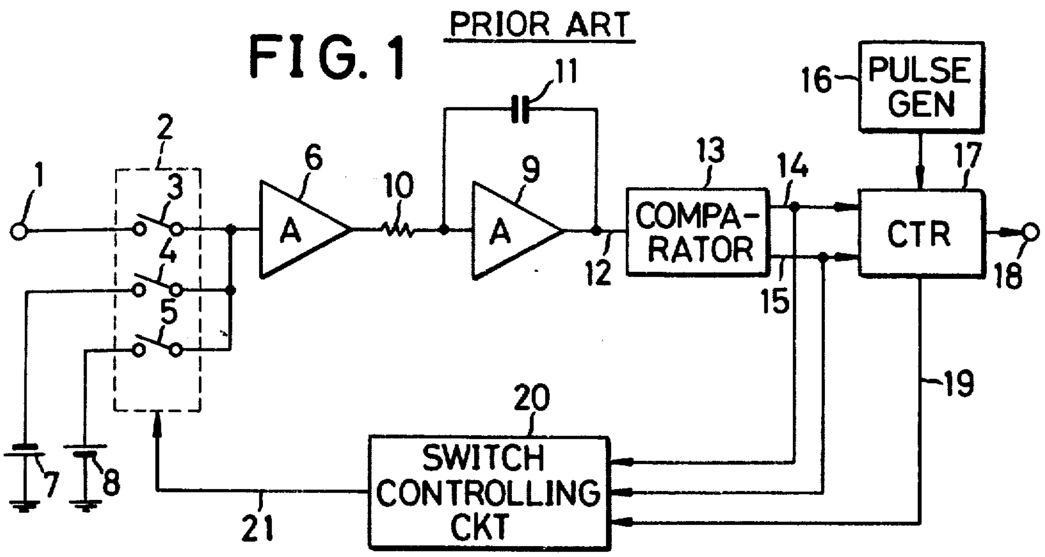
FIG. 1 is a circuit diagram showing a prior art digital voltmeter.

The circuit arrangement of a known digital voltmeter of dual slope integrating type is generally as shown in FIG. 1. An input terminal 1 for the input signal to be measured is connected to an input amplifier 6 through a switch 3. First and second standard voltage sources 7 and 8 of opposite polarity are similarly connected through swithes 4 and 5 respectively. The standard voltage sources 7 and 8 are generally provided by standard cells or Zener diodes. A changeover switch 2 including switches 3, 4 and 5 is connected so as to be controlled by a switch controlling circuit 20. The respective output terminals of switches 3, 4 and 5 are commonly connected to the preamplifier 6. The output of the pre-amplifier 6 is connected through an integrating resistor 10 of value R to an integrator formed by the parallel connection of a D.C. amplifier 9 of amplification $\mu_1$ and an integrating capacitor of value C. The output 12 of the integrating circuit is connected to a comparator 13 and from this comparator 13 a first output and a second output are available from a first output line 14 and a second output line 15 respectively. Although not illustrated, the comparator 13 is arranged having a first threshold and a second threshold and when the input signal thereto is positive, an output is available on the output line 14 when the integrated signal is below the first threshold and when the input signal is negative, an output is available from the output line 15 when the integrated signal is above the second threshold. The outputs of the comparator 13 control a counter 17. The counter 17 counts the number of pulses generated during a given period by a pulse generator 16 only for a space of time determined by the signals from the lines 14, 15. The digital output of the counter is available on an output terminal 18 and a line 19 connects the counter to the switch controlling circuit 20. The switch controlling circuit 20 is also connected to the output lines 14, 15 of the comparator 13. The output of the switch controlling circuit 20, that has been controlled by the signals from these three lines, is relayed to the changeover switch 2 through line 21 and controls switches 3, 4 and 5 included in the changeover switch 2. The switches 3, 4 and 5 are constituted by electronic switches.

When a positive input voltage of voltage value $V_1$ is applied to input terminal 1, switch 3 is initially closed, while switches 4 and 5 are open. The input signal is integrated to provide the waveform as illustrated in the period $T_1$ in FIG. 2 at the output of the integrating circuit consisting of resistor 10, capacitor 11 and amplifier 9, whereby a gradient $-(\mu_1 V_1/RC)$ becomes available on line 12. The signal gradually comes down and crosses the first threshold +0 set up beforehand in the comparator 13, whereupon the comparator generates an output pulse on the output line 14. This pulse is relayed to the counter 17 which starts counting pulses from the pulse generator 16. The counting lasts for a time $t_1$, in other words, until a predetermined number of pulses, for example $n$ pulses, has been counted. After the counting of $n$ pulses is over, the counter 17 resets and, at the same time, a signal is transmitted to line 19 and the switch controlling circuit 20 operates to open switch 3 and close switch 4. When the switch 4 is closed, the standard voltage of value $V_2$ whose polarity is opposite to the input voltage is applied to the integrating circuit from the standard voltage source 7 and then the signal shown during the time $T_2$ in FIG. 2 becomes available on line 12. At the same time the reset counter 17 starts counting again. During the period $T_2$, the integrated voltage increases with a gradient $(\mu_1 V_2/RC)$ and the signal re-crosses the first threshold +0. When the signal crosses the first threshold +0, the comparator 13 generates a pulse and this pulse is relayed to the counter 17 over line 14 and the counting is suspended. Thus the counter 17 ceases to count after counting for the time $t_2$, for example after counting m pulses. In accordance with the output of comparator 13 the switch controlling circuit 20 is controlled and, after the period $T_2$, switch 4 is switched off and switch 3 is closed again. The on- and off-states of switches 3, 4 and 5 when a positive signal voltage $V_1$ is applied to terminal 1 are tabulated as under:

Table 1

| Period | Switch No. | 3 | 4 | 5 |
|---|---|---|---|---|
| $T_1$ | | On | Off | Off |
| $T_2$ | | Off | On | Off |

It can be seen that:

$$\frac{t_2}{t_1} = \frac{m}{n} = \frac{V_1}{V_2}$$

whereby the voltage $V_1$ is given by the formula $V_1 = m/n\ V_2$.

For example, if $n$ is 1000 and $V_2$ is 1 volt, then when 542 pulses are counted during the time $t_2$, the signal voltage $V_1$ will be 0.542 V.

Figure 2:
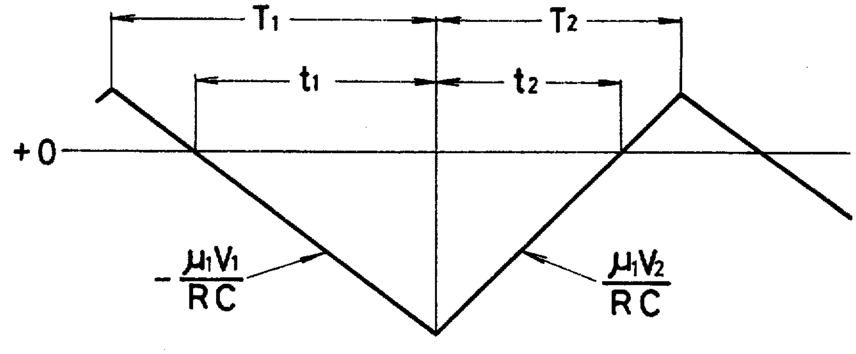
FIGS. 2 and 3 show a waveform diagram for explaining the operation of the digital voltmeter shown in FIG. 1.
Figure 3:
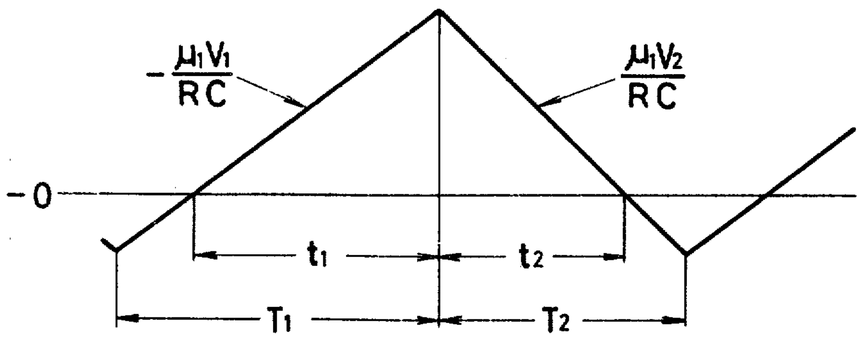

When the value of input signal voltage $V_1$ varies, the gradient $-(\mu_1 V_1/RC)$ of the signal during the period $T_1$ in FIGS. 2 and 3 varies; on the other hand, the gradient $-(\mu_1 V_2/RC)$ of the signal during the period $T_2$ is kept constant and, therefore, the time $t_2$ varies in proportion to the input signal voltage $V_1$, whereby the voltage $V_1$ can be measured.

The above explanation deals with the case where the input voltage $V_1$ is positive but, in the case of input voltage $V_1$ being negative, the respective switches are controlled as seen in the following table.

Table 2

| Period | Switch No. | 3 | 4 | 5 |
|---|---|---|---|---|
| $T_1$ | | On | Off | Off |
| $T_2$ | | Off | Off | On |

Thus the output waveform as shown in FIG. 3 becomes available on line 12. In order to measure the negative input signal voltage $V_1$, the second threshold −0 is used. The second threshold −0 and the signal on line 12 are compared by comparator 13 whose output is then available from line 15 and in accordance with this output the control and counting operations are effected. The discrimination between positive and negative polarities is carried out in accordance with the difference of polarity between the output waveform in FIG. 2 on line 12 and the output waveform shown in FIG. 3.

Figure 4:
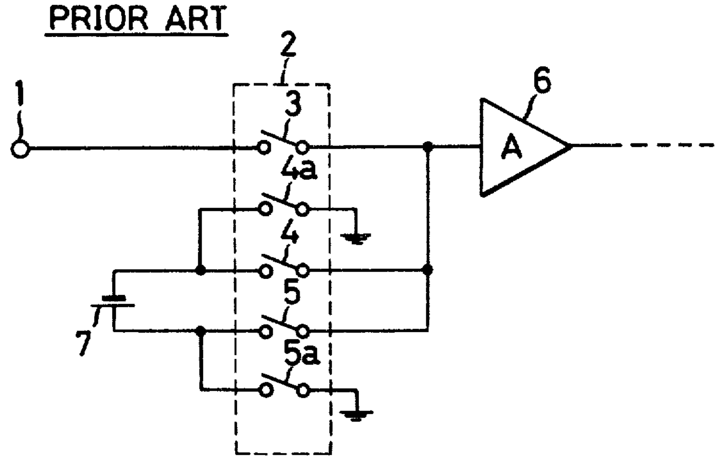
FIG. 4 PRIOR ART
FIG. 4 is a circuit diagram showing a known modification of digital voltmeter shown in FIG. 1.

With such an analog to digital converter, the measurement of voltage and other quantities is possible. However, when both positive and negative input voltages $V_1$ are to be measured, two standard voltage sources 7 and 8 of extremely high precision are needed, whereby the cost of equipment becomes high. Because of this problem, it is known to use a single standard voltage source 7 and modified changeover switch 2 as illustrated in FIG. 4. Thus, switches **4*a* and 5*a*** are added and the actuation of the switches when the input signal voltage $V_1$ is positive is tabulated as follows.

Table 3

| Period | Switch No. | 3 | 4 | 4a | 5 | 5a |
|---|---|---|---|---|---|---|
| $T_1$ | | On | Off | Off | Off | Off |
| $T_2$ | | Off | On | Off | Off | On |

The actuation of the switches when the input signal voltage $V_1$ is negative is tablated as under:

Table 4

| Period | Switch No. | 3 | 4 | 4a | 5 | 5a |
|---|---|---|---|---|---|---|
| $T_1$ | | On Off | Off | Off | Off | |
| $T_2$ | | On | Off | On | Off | Off |

The standard voltage source 7 is thereby made to act as either a positive or negative reference source, but only at the expense of addding the two switches 4a and 5a.

If resistance value is to be measured by the digital voltmeter shown in FIG. 1 or 4, a constant-current source of high precision will be needed, thereby further increasing the cost of the equipment.

If a digital multimeter is made up in accordance with the digital voltmeter shown in FIGS. 1 and 4, a high precision constant-current source and a constant voltage source and a resistor are needed, which makes the cost of the equipment high.

Figure 5:
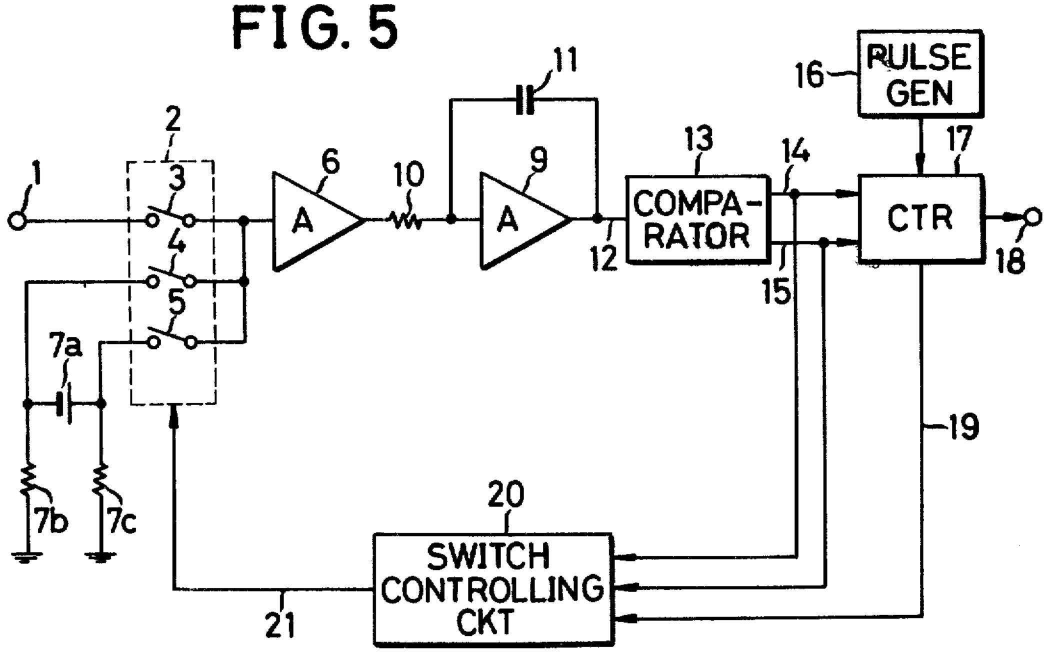
FIG. 5 is a circuit diagram showing a digital voltmeter embodying this invention.

The elements of the embodiment of the invention shown in FIG. 5 which operate similarly to the elements of FIG. 1 have the same reference. In FIG. 5, a resistor **7*b*** having value $R_1$ is connected between one end of a single standard voltage source 7*a* and ground and a resistor 7*c* having value $R_2$ is connected between the other end of the standard voltage source 7*a* and ground. The voltage value $V_3$ of the standard voltage source 7*a* is preferably twice the value $V_2$ of the standard voltage source in FIGS. 1 and 4, i.e. $V_3 = 2V_2$ while the resistance values $R_1$ and $R_2$ are preferably equal.

The changeover switch 2 is provided with three switches 3, 4 and 5. The switch 3 is connected with input terminal 1, the switch 4 with one end of resistor 7*b* and the switch 5 with one end of resistor 7*c* respectively.

When the input terminal 1 receives a positive input voltage $V_1$, the operations tabulated in Table 1 are performed and, during $T_2$, the source 7*a* acts as a negative source in series with resistor 7*c*.

On the other hand, when the input voltage is negative, the operations of Table 2 apply and, during $T_2$, the source 7*a* acts as a positive source in series with the resistor 7*c*.

It will be seen that FIG. 5 has one voltage source less than FIG. 1 and two switches less than FIG. 4. If resistors 7*b* and 7*c* are equal, the magnitude of the standard voltage is the same for positive and negative measurements. If necessary, a resistor can be put in series with the source 7*a* for adjusting the standard voltage value.

Figure 6:
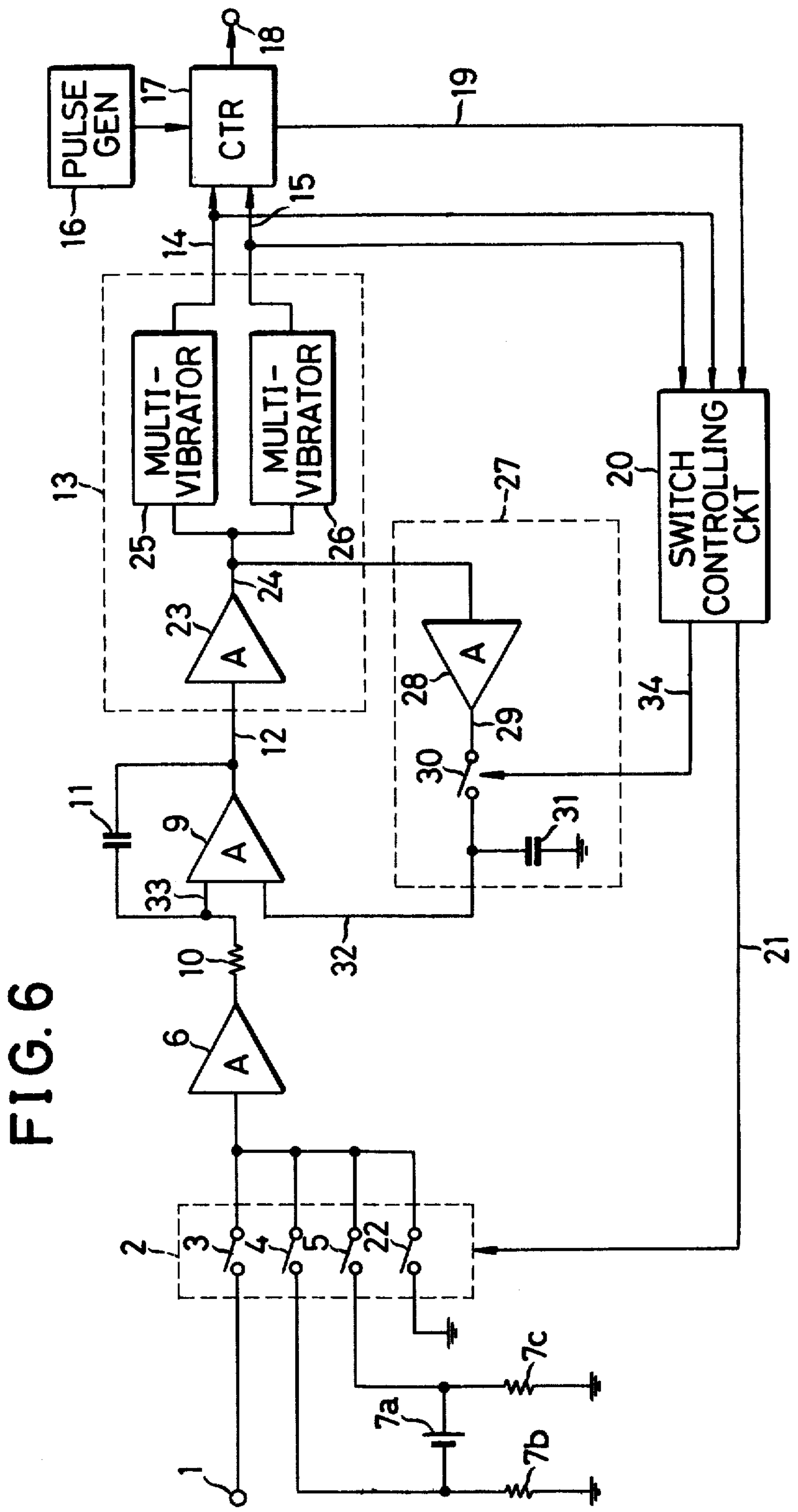
FIG. 6 is a circuit diagram showing another digital voltmeter embodying this invention.

FIG. 6 illustrates another embodiment having a drift memory circuit 27 and in which the comparator 13 is shown in detail. The comparator 13 comprises an amplifier 23 having high gain and two bistable multivibrators or flip-flops 25, 26. The amplifier 23 works as a post-amplifier amplifier for the integrating circuit. The drift memory circuit 27 is connected between the output line 24 of the amplifier 23 and an input line 32 of the D.C. amplifier 9, this being now a differential amplifier.

The drift memory circuit 27 comprises a D.C. amplifier 28 connected to the output line 24, and a switch 30 connecting the output 29 of the D.C. amplifier 28 to a memory capacitor 31 connecting line 32 and ground. In order to detect a drift by this drift memory circuit 27, a switch 22 is connected to the switch controlling circuit 20 which is switched on or off synchronously with the switch 30, whereby the switch 22 is switched on only while the switch 30 is switched on by the signal from a line 34. Thus the drift of the output of amplifier 23 from ground level is memoried by the capacitor 31. In this circuit, the phase of input line 33 of the amplifier 9 is opposite to the phase of output line 12. The phase of line 12 is opposite to that of line 24. Further, the phase of line 24 is the same as that of output line 29. The multivibrator 25 operates when a positive voltage is applied to that input terminal 1 while the multivibrator 26 operates when a negative voltage is applied to the input terminal 1.

Figure 8:
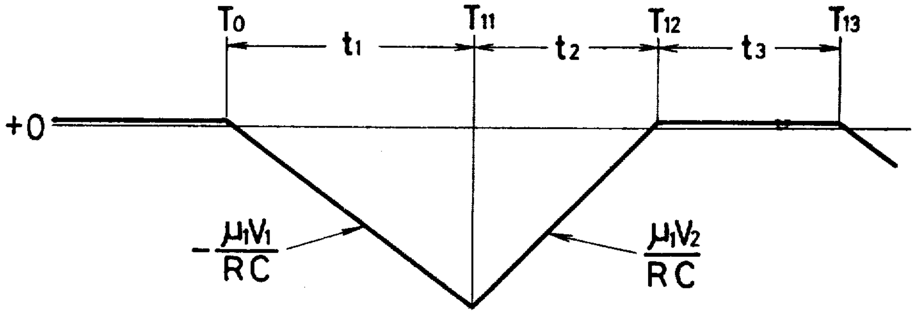
FIGS. 8 and 9 are waveform diagrams for explaining the operation of the digital voltmeter shown in FIG. 6.

When a positive input voltage $V_1$ is applied to the input terminal 1, when the switch 3 is closed at time $T_0$ in FIG. 8 and the switches 4, 5, 22 and 30 open, the waveform on the output line 12 of the integrating circuit ramps negatively. The waveform immediately crosses the first threshold +0 and the output signal is transmitted on line 14 to the counter 17 to enable the counter 17 to count the number *n* of pulses establishing the fixed period $t_1$. When the counter 17 finished counting the predetermined number of pulses, i.e. when the period $t_1$ has elapsed, the counter 17 will be reset and transmit a signal to the switch controlling circuit 20. By this, the switch 3 is switched off and the switch 4 is closed. Therefore, the voltage $V_2$ of polarity opposite to the input is applied, a gradient $(\mu_1 V_2/RC)$ becomes available at time $T_{11}$ and crosses the first threshold +0 at time $T_{12}$ to generate an output pulse on line 14 of the comparator. By this, the counting by the counter 17 is suspended and, at the same time, the output pulse of the comparator is transmitted from line 14 to the switch controlling circuit 20 and the switch 4 is switched off while the switches 22, 30 are closed. Therefore, during period $t_3$, the input is grounded and any deviation from ground at the line 24 is stored on capacitor 31 to act as a correcting offset at the input to amplifier 9 during the ensuing periods $t_1$ and $t_2$. When period $t_3$ elapses, the actuation of a timer circuit in the switch controlling circuit 20 opens the switches 22, 30 at time $T_{13}$ and the switch 3 is again closed.

The actuation of the respective switches is tabulated as under:

Table 5

| Period | Switch No. | 3 | 4 | 5 | 22 | 30 |
|---|---|---|---|---|---|---|
| $t_1$ | | On | Off | Off | Off | Off |
| $t_2$ | | Off | On | Off | Off | Off |
| $t_3$ | | Off | Off | Off | On | On |

In the case of a negative input voltage, the actuation of the switches is tabulated as follows:

Table 6

| Period | Switch No. | 3 | 4 | 5 | 22 | 30 |
|---|---|---|---|---|---|---|
| $t_1$ | | On | Off | Off | Off | Off |
| $t_2$ | | Off | Off | On | Off | Off |
| $t_3$ | | Off | Off | Off | On | On |

Figure 9:
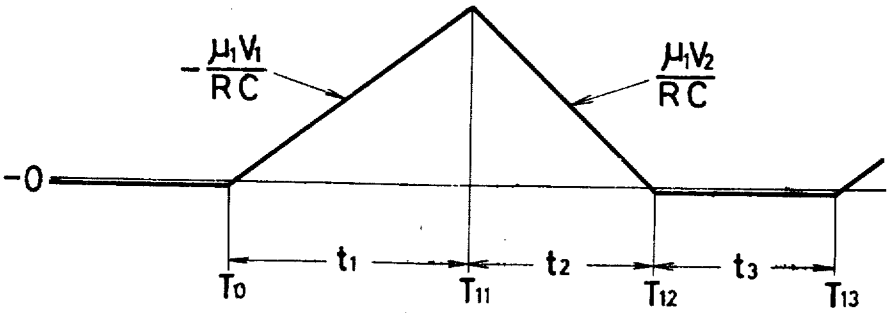

FIG. 9 shows the output waveform of line 12 when the input signal voltage $V_1$ is negative. Determination of polarity of the input voltage $V_1$ is effected by the selective actuation of multivibrators 25, 26 as the polarity of the output waveform of the amplifier 9 varies according to the nature, i.e. positive or negative, of the input voltage $V_1$. As to the drift memory circuit 27, a detailed description is given in U.S. Pat. No. 3,662,055. When the digital voltmeter is made up as illustrated in FIG. 6, voltage measurement can be carried out simply using only one floating standard voltage source 7*a* to lower the cost of the equipment.

Figure 7:
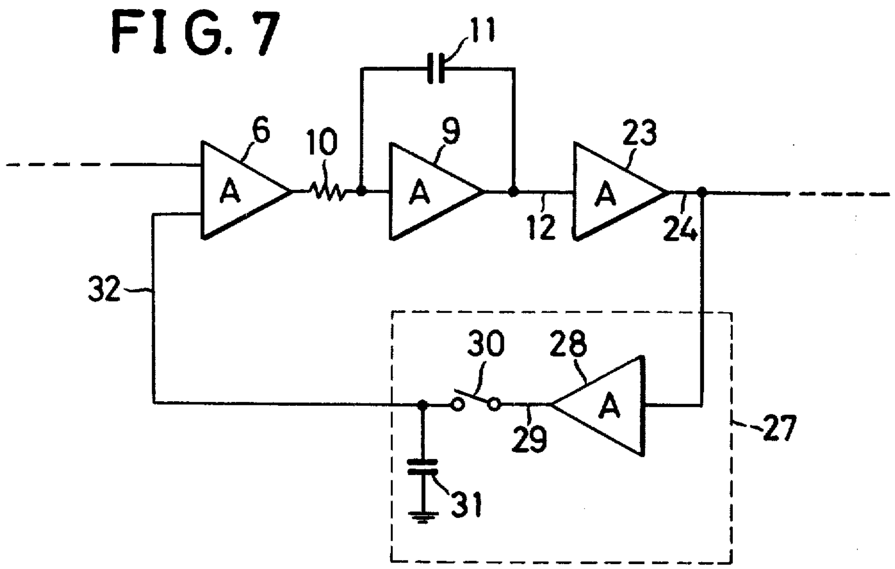
FIG. 7 is a circuit diagram illustrating a modification of the embodiment shown in FIG. 6.

In FIG. 6 the output line 32 of the drift memory circuit 27 is connected to the integrating amplifier 9 but the same effect is also available when the output line 32 is connected to the pre-amplifier 6 as shown in FIG. 7, this now being a differential amplifier. Alternatively, if the inverting amplifier 23 is omitted and the circuit 27 is connected directly to line 12, the line 32 can be connected to the single input of amplifier 9.

Figure 10:
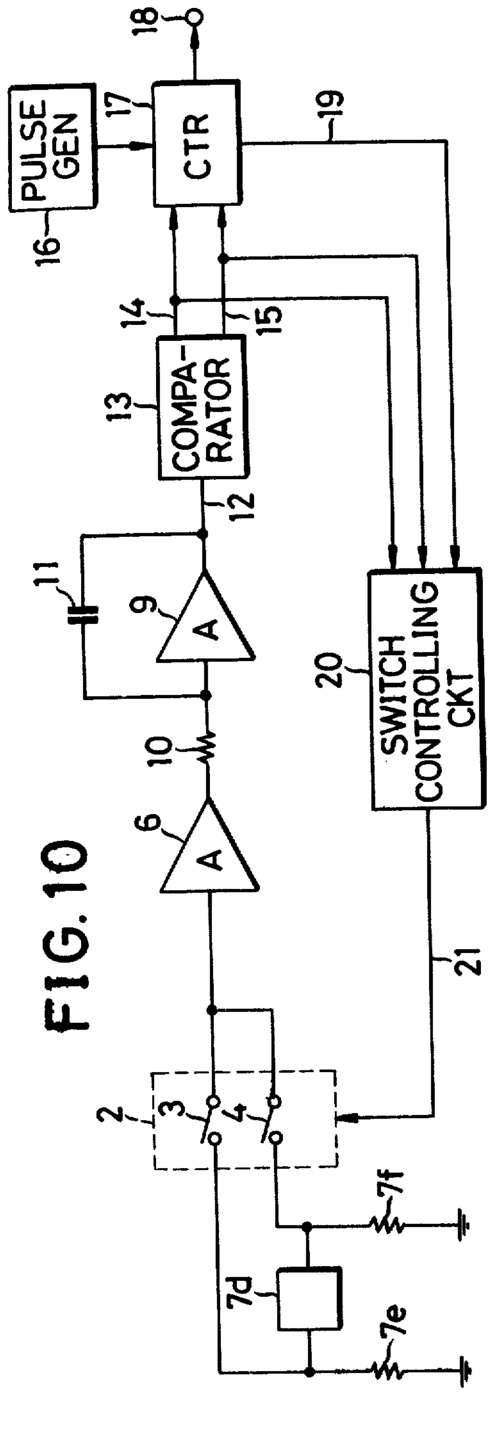
FIG. 10 is a circuit diagram of a digital ohmmeter embodying this invention.

FIG. 10 is a circuit diagram showing an embodiment of digital ohmmeter. The fundamental composition of this digital ohmmeter is the same as the digital voltmeter illustrated in FIG. 5, whereby like elements have the same references. In this digital ohmmeter, a floating power source 7*d* is used, one terminal being connected to ground through the unknown resistor 7*e* of value Rx and the other terminal being connected to ground through a standard resistor 7*f* of value *Rs*.

The changeover switch 2 has only two switches 3, 4. The switch 3 is connected to the end of resistor 7*e* while the switch 4 is connected to the end of standard resistor 7*f*.

In order to measure the resistance value of the resistor 7*e*, the switch 3 is switched on first of all. If the source 7*d* has a high impedance, it can be assumed that a constant current I flows therethrough. During $t_1$ the input voltage $V_1$ is therefore IRx. During $t_2$ when switch 4 is closed, $V_2$ is equal to IRs, but is of opposite polarity. Therefore we have $$\frac{t_2}{t_1} = \frac{m}{n} = \frac{V_1}{V_2} = \frac{IRx}{IRs} = \frac{Rx}{Rs}$$

Now, assuming the counter 17 counted m = 542 during $t_2$ and that $n$ = 1,000 counts, if Rs = 1KΩ, Rs is 542Ω. Alternatively, if the counter 17 counts m = 1263, and Rs = 100 MΩ, Rx is 126.3MΩ.

The actuation of the switches 3, 4 with reference to FIG. 10 is tabulated as follows:

Table 7

| Period | Switch No. | 3 | 4 |
|---|---|---|---|
| $T_1$ | | On | Off |
| $T_2$ | | Off | On |

By forming the digital ohmmeter as shown in FIG. 10, the resistance value can be measured without being affected by the value of the voltage of (within limits) the impedance of the floating power source 7*d*. The extra standard current source conventionally employed will become unnecessary and, at the same time, the circuit composition of the changeover switch 2 is simplified, resulting in lowering of the cost.

Figure 11:
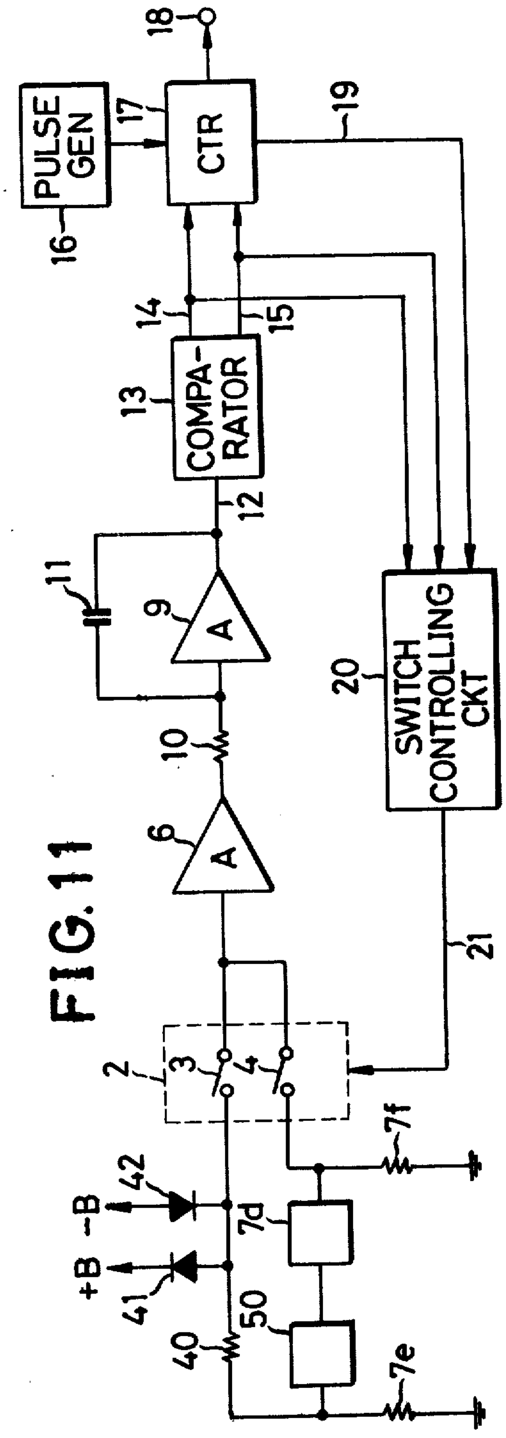
FIGS. 11, 12 and 13 are circuit diagrams illustrating modifications of the embodiment shown in FIG. 10.

FIG. 11 is a modification of the digital ohmmeter shown in FIG. 10. In the digital ohmmeter shown in FIG. 10, the value of voltage, current and impedance of the source 7*d* does not affect the precision of the measurement so that in FIG. 11 a protecting circuit 50 for excessive voltage is connected in series with the power source 7*d*. For example, the protecting circuit 50 comprises a transistor circuit able to withstand a high voltage connected between a circuit applying a high voltage and a circuit to be protected from for excessive voltage, a resistance circuit applying base current to the transistor of the transistor circuit, a detecting resistor connected in series with the transistor circuit, a controlling transistor circuit or thyristor circuit connected in series with the said resistance circuit and being arranged to turn on or off according to the voltage drop across the detecting resistor, a diode circuit capable of withstanding high voltages for prevention of high reverse voltages being applied to the transistor circuit and a diode circuit connected in parallel with a protective circuit for the said excessive voltage, being substantially and, at same time, conductive at the time of applying an excessive voltage.

When the protecting circuit 50 is connected, the voltage source 7*d* and standard resistor 7*f* are protected even if such a high voltage as 1,000V is erroneously applied.

On the circuit of FIG. 11, a circuit protecting the changeover switch 2 and the amplifier 6 is further added, namely, a protecting circuit comprising a resistor 40, diodes 41, 42 and bias voltage sources +B and −B. If +B is +5V, −B is −5V and the value of the resistor 40 is 100KΩ, if erroneously +1000V was generated across the resistor 7*e*, one end of the resistor 40 would be +1000V while the other end will be at approximately +5.7V since the diode 41 turns to a conductive state, the potential of the anode side of this diode 41 is held at approximately +5.7V and the changeover switch 2, pre-amplifier 6 etc. are protected. If −1000V is erroneously applied, the diode 42 will conduct to protect the circuit.

Figure 12:
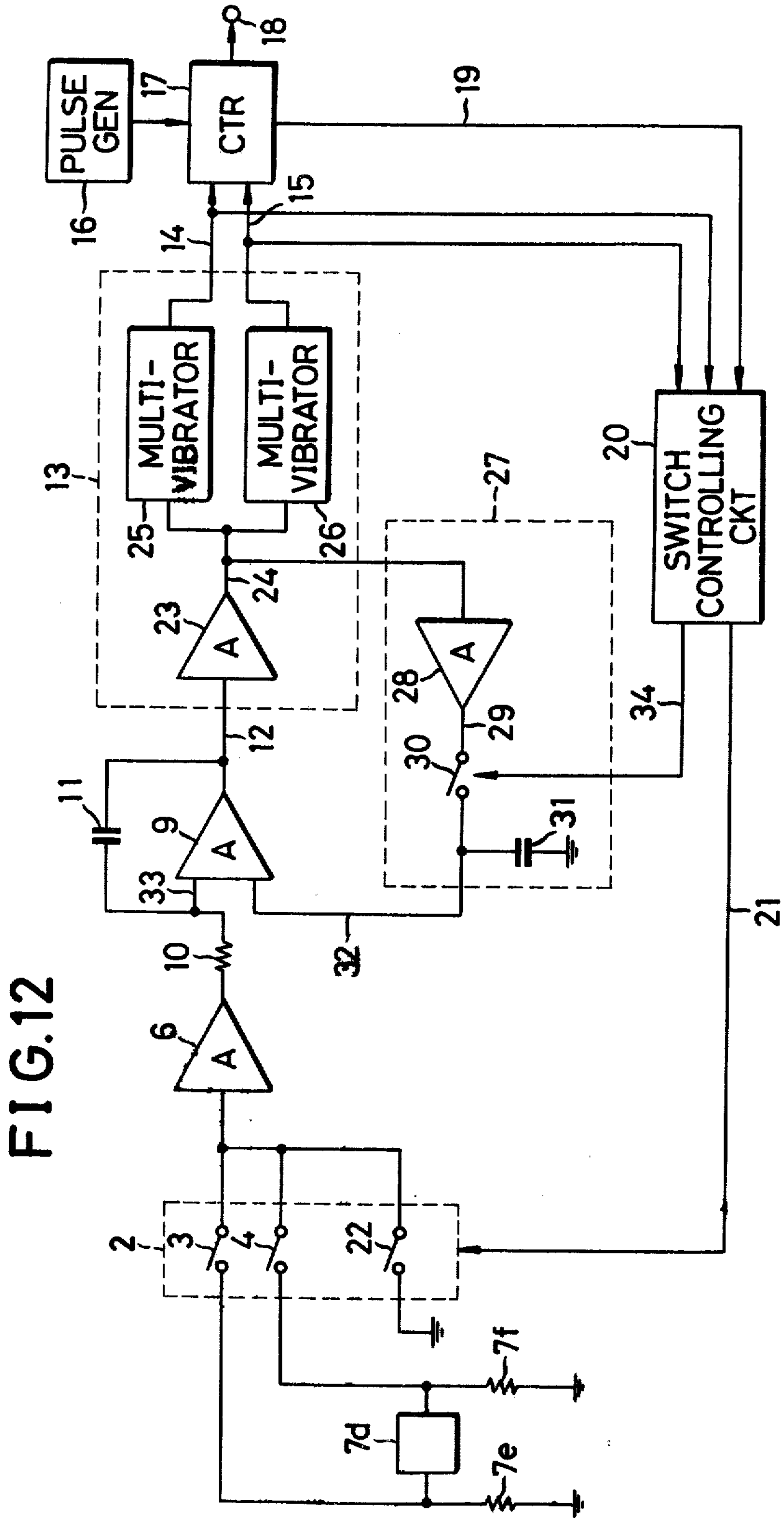

FIG. 12 illustrates a modified embodiment of the digital ohmmeter on FIG. 10, the drift correction circuitry of FIG. 6 having been added. Therefore, an output waveform as shown in FIG. 8 or FIG. 9 becomes available with elimination of drift error in the analog to digital conversion.

The actuation of the switches 3, 4, 22 and 30 in FIG. 12 is tabulated as follows in accordance with the respective periods in FIG. 8:

Table 8

| Period | Switch No. | 3 | 4 | 22 | 30 |
|---|---|---|---|---|---|
| $t_1$ | | On | Off | Off | Off |
| $t_2$ | | Off | On | Off | Off |
| $t_3$ | | Off | Off | On | On |

According to the digital voltmeter shown in FIG. 12, it is possible to get the same effect as that of digital voltmeter illustrated in FIG. 10 and also a high precision measurement that has been eliminating errors by means of drift.

Figure 13:
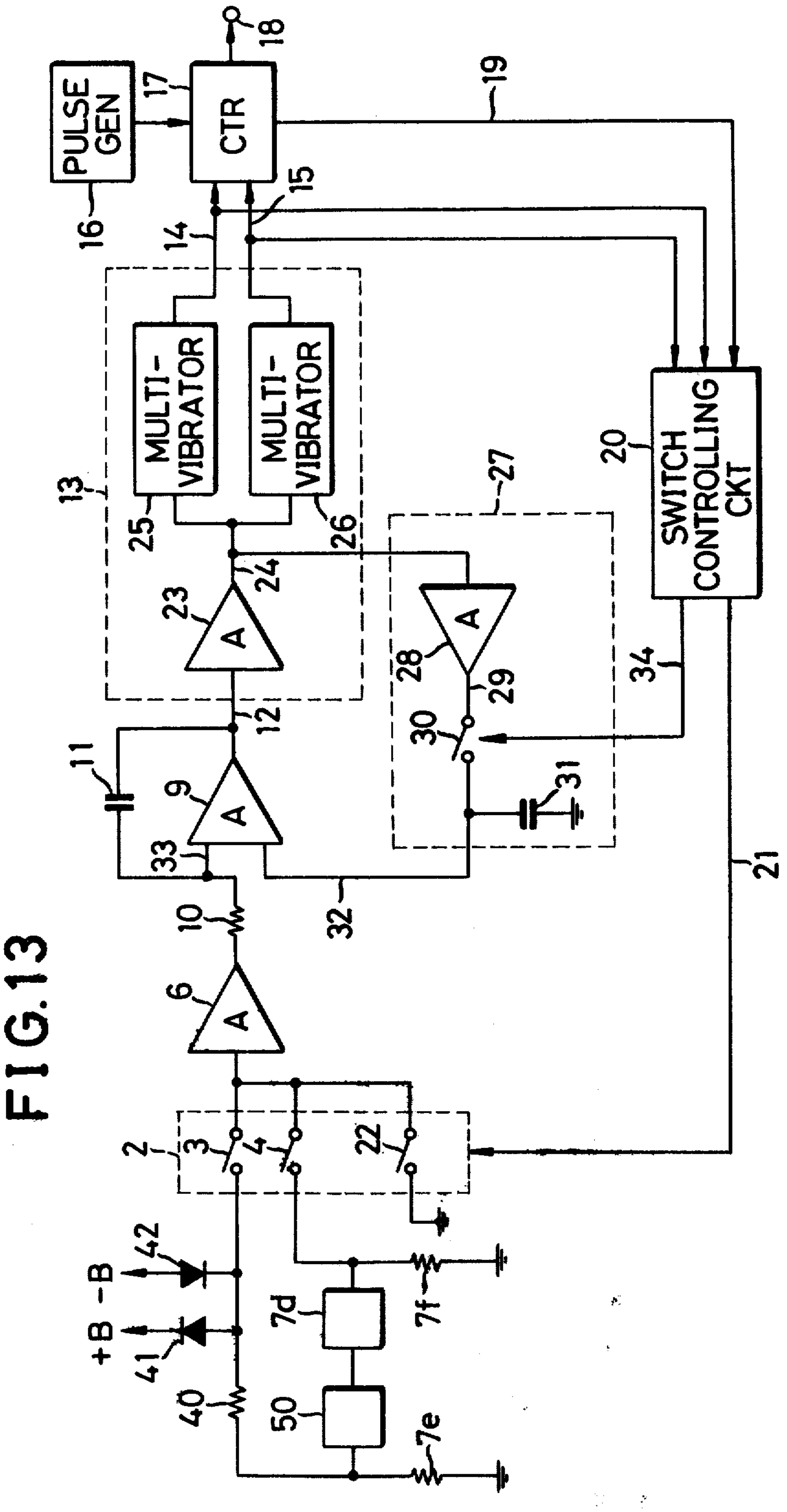

FIG. 13 shows a modified embodiment of the digital ohmmeter illustrated in FIG. 10 in which the improvements of both FIG. 11 and FIG. 12 have been incorporated.

Figure 14:
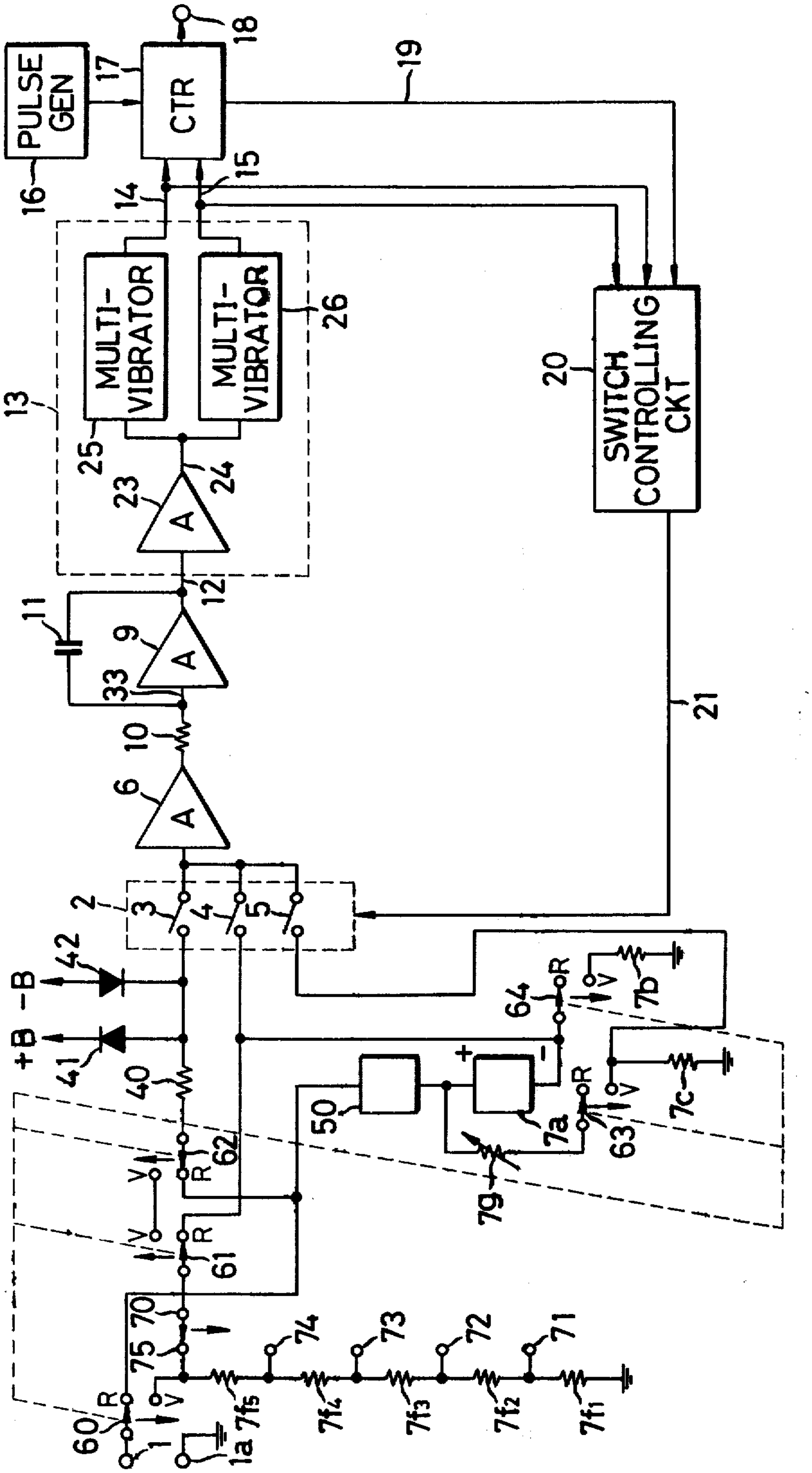
FIG. 14 is a circuit diagram showing a digital multimeter embodying this invention.

FIG. 14 is a circuit diagram of digital multimeter enabling one to measure voltage and resistance. This embodiment is a modified combination of the digital voltmeter in FIG. 5 and the digital ohmmeter in FIG. 11. In FIG. 14 the unknown voltage is connected to terminal 1 for voltage measurements and the unknown resistor is connected between terminal 1 and the grounded input terminal 1*a* for resistance measurements. Ganged switches 60 to 64 have a position R for resistance measurements and a position V for voltage measurements. In position V, the terminal 1 is connected to a chain of resistors 7*$f_1$* to 7*$f_5$* and a range selecting switch contact 70 is connected by switches 61 and 62 to the switch 3 via the protective circuit 40, 41, 42. The contact 70 can be switched to any of taps 71 to 75 whereby the resistors 7*$f_1$* to 7*$f_5$* act as a variable range-selecting potential divider or attenuator, in a manner known per se. Also in position V, the switches 63 and 64 connect the ends of the standard voltage source to equal resistors 7*b* and 7*c* and to the switches 4 and 5, whereby the circuit configuration of FIG. 5 is established.

In the position R switches 63 and 64 disconnect the resistors 7*b* and 7*c*. Instead switches 60 and 62 connect the unknown resistance (between terminals 1 and 1*a*) to one end of the voltage source 7*a*, 50 and to the switch 3. Switch 61 connects the reference resistor, consisting of that portion of the chain 7*$f_1$* to 7*$f_5$* which is selected by the range selecting switch 70, to the switch 4 and to the other end of the voltage source 7*a*, 50. Accordingly the circuit configuration of FIG. 11 is established.

During voltage measurements, a variable resistor 7g serves to adjust the reference voltage.

The operation of the meter need not be described as it is the same as for FIG. 5 in the case of voltage measurement and as for FIGS. 10 and 11 in the case of resistance measurement.

In measuring voltage and resistance, if a change of setting is made of switch 70, the range of measurement can be changed. For example, assuming that the standard resistors $7f_1$, $7f_2$, $7f_3$, $7f_4$ and $7f_5$ are 1 KΩ, 9 KΩ, 90 KΩ, 900 KΩ, and 9MΩ, respectively, the attenuation ratio at the contacts 71, 72, 73, 74 and 75 is 1/10,000, 1/1000, 1/100, 1/10 and 1/1 whereby assuming that the sensitivity when the attenuation ratio is 1/1 is 0.2V full scale, the measurement range can be changed to 2000V, 200V, 20V, 2V and 0.2V through the change in attenuation ratio. During resistance measurements, the standard resistors between contacts 71, 72, 73, 74 and 75 and ground are 1 KΩ, 10 KΩ, 100 KΩ, 1MΩ and 10 MΩ respectively.

When the digital multimieter is constructed as in FIG. 14, voltage measurement and resistance measurement can be performed using one voltage source 7a and also the composition of the changeover switch 2 is simplified. As it is possible to use the resistors $7f_1$, $7f_2$, $7f_3$, $7f_4$ and $7f_5$ of the attenuator of the voltage measurement circuit as standard resistors for the resistance measurement circuit, the cost of the equipment can be lowered and the equipment itself can be protected from excessive voltages.

Figure 15:
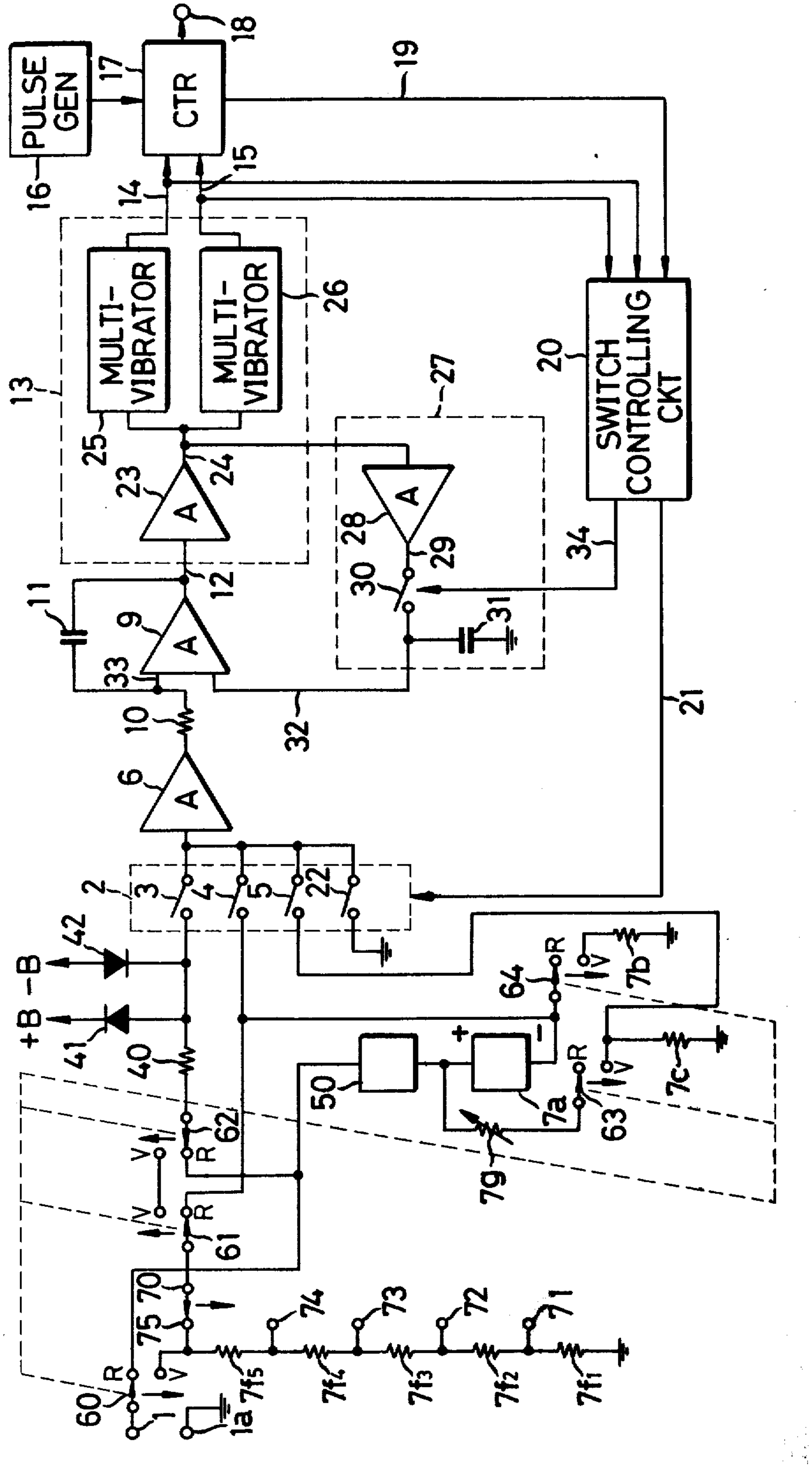
FIG. 15 is a circuit diagram illustrating a modification of the embodiment shown in FIG. 14.

FIG. 15 illustrates a modified embodiment of the digital multimeter in FIG. 14, the drift correction circuitry of FIG. 6 having been added. Therefore, an output waveform as shown in FIG. 8 or FIG. 9 becomes available with elimination of drift error in the analog to digital conversion.

What is claimed is:

1. A dual slope integrating analog to digital converter comprising an integrating circuit, a voltage source having first and second terminals connected to ground through a first unknown resistor and a second reference resistor, said voltage source supplying a direct current simultaneously to said first and second terminals, first and second switches connecting the first and second terminals to the input of said integrating circuit, a switch controlling circuit for closing one of the switches at a predetermined instant, a comparator circuit responsive to the output of said integrating circuit and controlling said switch controlling circuit to open said one switch when the output of said integrating circuit reaches a predetermined threshold, and means for counting clock pulses while said one switch is closed, said counting means closing the first switch for a predetermined interval of time terminating at said predetermined instant and then closing the second switch.

2. A converter according to claim 1, comprising an excess voltage protection circuit in series with said voltage source for protecting said voltage source.

3. A converter according to claim 1, comprising a series resistor between said first terminal and the first switch and biased diodes connected to the first switch for preventing the application of an excesss voltage to said integrating circuit.

4. A converter according to claim 1, comprising a multi-pole changeover switch for establishing voltage and resistance measuring configurations such that, in the voltage measuring configuration, an input terminal is connected to said integrating circuit through a third switch, said first and second resistors are connected to said two terminals of said voltage source, and said counting means are arranged to close the third switch for a predetermined interval terminating at said predetermined instant and said switch controlling circuit is arranged under the control of said comparator circuit to close one or the other of the first and second switches in dependence upon the polarity of the output of the integrating circuit at said predetermined instant, whereas in the resistance measuring configuration said first and second terminals are respectively connected to the first and third switches, said first terminal is connected to said input terminal for connection between said first terminal and ground of an unknown resistor replacing said first resistor, and said second terminal is connected to ground through a further, reference resistor replacing said second resistor, said counting means being arranged to close the third switch for said predetermined interval and then to close the first switch.

5. A converter according to claim 4, wherein said reference resistor is formed by a chain of resistors and a range selecting switch for connecting different numbers of the resistors between the first switch and ground.

6. A converter according to claim 5, wherein, in the voltage measuring configuration, the chain of resistors acts as a range-selecting attenuator, said input terminal being connected to the end of the chain of resistors and said range-selecting switch being connected to the third switch.

7. A converter according to claim 4, comprising an over-voltage protection circuit arranged so as to be connected in the resistance measuring configuration between said input terminal and said second terminal.

8. A converter according to claim 4, wherein the connection to said third switch is through a series resistor and biased diodes are connected to the third switch for preventing the application of an excess voltage to said integrating circuit.

9. A converter according to claim 1, comprising a drift correcting circuit including a storage capacitor connected to an input to the integrating circuit for applying a drift-correcting voltage thereto, and further switch means operable when none of the previous said switches is closed to connect the input to the integrating circuit to ground and an output from the integrating circuit to the storage capacitor.

10. A dual slope integrating analog to digital converter for use as a digital resistance meter, comprising an integrating circuit, a power source having first and second terminals, means for connecting an unknown resistor between said first terminal and ground, a reference resistor connected between said second terminal and ground, said power source supplying a direct current simultaneously to said unknown resistor and said reference resistor, first and second switches for connecting said first and second terminals respectively to said integrating circuit, clock pulses counter means for closing one of said switches for a predetermined interval and then for closing the other of said switches, a comparator circuit responsive to the output of said integrating circuit to open said other switch when said output reached a predetermined threshold, and means operative to cause said counter means to count clock pulses during the time said other switch is closed.

11. A converter according to claim 10, comprising an excess voltage protection circuit in series with said power voltage source for protecting said power source.

12. A converter according to claim 10, comprising a series resistor between said first terminal and the first switch and biased diodes connected to the first switch for preventing the application of an excess voltage to said integrating circuit.

13. A dual slope integrating analog to digital converter for use as a digital multimeter, comprising an integrating circuit, an input terminal for receiving a voltage to be measured, a first switch for connecting said input terminal to said integrating circuit, a standard voltage source having first and second terminals, a multipole change-over second switch having first and second settings and operative in said first setting to connect said input terminal to said first switch and operative in said second setting to connect said input terminal to said second terminal, first and second resistors connected between ground and first and second resistor terminals, said standard voltage source supplying a direct current simultaneously to said first and second resistors, said second switch being operative in said first setting to connect said resistor terminal, to said first and second terminals respectively, a third switch for connecting said first terminal to said integrating circuit, a fourth switch for connecting said second resistor terminal to said integrating circuit, a reference resistor connected between ground and a third terminal, said second switch being operative in said second setting to connect said further terminal to said first terminal and said third switch, and control means operative to close said first switch for a predetermined interval and then to close one of said third and fourth switches for an internal terminating when the output of said integrating circuit reaches a predetermined threshold.

14. A converter according to claim 13, wherein said reference resistor comprises a chain of resistors connected between ground and a fourth terminal and a range selecting switch for connecting said third terminal to different taps along said chain of resistors.

15. A converter according to claim 14, wherein said second switch is operative in said first seting to connect said input terminal to said fourth terminal and to connect said third terminal to said first switch.

* * * * *